United States Patent
Kuzmenka

(10) Patent No.: US 7,196,406 B2
(45) Date of Patent: Mar. 27, 2007

(54) ESD PROTECTION APPARATUS FOR AN ELECTRICAL DEVICE

(75) Inventor: Maksim Kuzmenka, München (DE)

(73) Assignee: Infineon Technologies AG, Munich (DE)

( * ) Notice: Subject to any disclaimer, the term of this patent is extended or adjusted under 35 U.S.C. 154(b) by 35 days.

(21) Appl. No.: 10/994,977

(22) Filed: Nov. 22, 2004

(65) Prior Publication Data

US 2006/0108637 A1    May 25, 2006

(51) Int. Cl.
- H01L 23/20 (2006.01)
- H01L 23/22 (2006.01)
- H01L 23/24 (2006.01)
- H01L 23/62 (2006.01)
- H01L 23/34 (2006.01)

(52) U.S. Cl. .................. 257/682; 257/276; 257/355; 257/522; 257/687; 257/721

(58) Field of Classification Search ............. 257/355, 257/687, 721, 276, 522, 682
See application file for complete search history.

(56) References Cited

U.S. PATENT DOCUMENTS

| | | | | |
|---|---|---|---|---|
| 5,173,766 A | * | 12/1992 | Long et al. | 257/687 |
| 5,405,808 A | * | 4/1995 | Rostoker et al. | 29/841 |
| 6,117,705 A | * | 9/2000 | Glenn et al. | 438/106 |
| 6,248,380 B1 | * | 6/2001 | Kocher et al. | 426/127 |
| 6,268,654 B1 | * | 7/2001 | Glenn et al. | 257/704 |
| 6,526,890 B1 | * | 3/2003 | Rouer et al. | 102/202.12 |
| 6,606,230 B2 | * | 8/2003 | Sawada et al. | 361/118 |
| 6,670,023 B2 | * | 12/2003 | Mueller | 428/189 |
| 7,073,375 B2 | * | 7/2006 | Parker et al. | 73/118.1 |
| 2002/0168798 A1 | * | 11/2002 | Glenn et al. | 438/110 |
| 2003/0089979 A1 | * | 5/2003 | Malinowski et al. | 257/724 |
| 2003/0199119 A1 | * | 10/2003 | Lin | 438/107 |

* cited by examiner

Primary Examiner—Ida M. Soward
(74) Attorney, Agent, or Firm—Slater & Matsil, L.L.P.

(57) ABSTRACT

An ESD protection apparatus for an electrical device with a circuit structure having an internal terminal, which is connected to an external terminal of the electrical device via a conductive connection, has a gas-filled cavity, through which the conductive connection extends at least partly, and a reference electrode in the cavity, wherein the conductive connection is disposed such in the cavity, that when applying a potential exceeding a predetermined threshold to the external terminal, a gas discharge occurs from the conductive connection to the reference electrode.

22 Claims, 1 Drawing Sheet

ESD PROTECTION APPARATUS FOR AN ELECTRICAL DEVICE

BACKGROUND OF THE INVENTION

1. Field of the Invention

The present invention relates to an ESD protection apparatus for an electrical device.

2. Description of the Related Art

In microelectronics, more and more integrated circuits with low structure widths are utilized. These lower structure widths enable higher clock rates of the integrated circuits and thus higher data rates of the signals at the pins of the integrated circuits. In order to enable a communication between two electrical devices, which is as interference-free as possible, it is required to make the leading and falling edges of the transmitted bits as steep as possible. Therefore, it is required to keep the capacitive loads at the inputs and outputs of an integrated circuit as low as possible. These capacities do lead to a flattening of the curves of the current and voltage flows at the inputs and outputs of the integrated circuit.

An integrity of the signal in modern integrated circuits depends mainly on the input capacitance of the input and output stages. Thus, these modern integrated circuits operate with bit rates in the range of several Gigahertz. The input signal slew-rate and an ISI (intersymbol interrereference), respectively, of the signal is influenced largely by the input capacitance of the input and output stages.

The capacitances of the inputs and outputs consist of a capacitance of the off-chip driver elements, an input capacitance of the chip, a package capacitance and a capacitance of an ESD protection structure (ESD=Electro Static Discharge). The proportion of the capacitance of the ESD structure, is up to 30% of the overall capacitance of the input and output stages and even up to 70% of the input stage of only input pins.

Integrated circuits have to survive a connection charged with up to 1000 V or more than 100 pF capacitance of human body or an assembling machinery. Diodes or any other kind of protection devices, which are used for such protection must be relatively large.

To allow an increase of the bit rate of memory data or command address buses or other chip-to-chip or board-to-board data transmission systems, the capacitance of the diodes, which are used for protection from overvoltages, should be kept as low as possible. This is typically accompanied with reduction of the area of the diode, which is used as ESD protection structure.

The ESD protection structure present on the chip and its capacitance stand thus in the way of increasing the data rate of a signal on a data bus, which is connected to a pin and to several pins, respectively, of a chip.

FIG. 3 explains the cross-section structure of an exemplary BGA (BGA=Ball Grid Array) package. The chip 11, a package substrate 21, traces 31, solder balls 41, bonding wires 51 and the chip pads 61 are illustrated.

The chip 11 is deposited on the package substrate 21. The traces 31 are deposited on the surface of the package substrate 21 opposite to the chip 11, whereon again the solder balls 41 are disposed. The chip pads 61, which are electrically connected to the traces 31 via the bond wires 51, are attached to the chip 11.

By the structure shown in FIG. 3, an electrically conductive connection is established between the solder balls 41 and the chip pads 61. Thereby, the solder balls 41 are electrically conductively connected to the trace 31, which is again electrically conductively connected to the chip pads 61 via the bonding wires 51. Via the structure shown in FIG. 3, electrical signals originating from a circuit board not shown here and transmitted by the same to the solder ball 41 are transmitted from there to the chip pads 61. The connection between chip pad 61 and solder ball 41 is thus part of a signal path, which, for example, a signal passes between the chip 11 and an adjacent chip not shown here.

Typically, an ESD protection diode or a plurality of ESD protection diodes is attached in between the chip I/O pad 61, and internal chip supply wires like a GND and a VDD for example in order to protect the chip 11 from electrical overloads. This capacitance of the ESD protection diode not shown here leads to a flattening of the preferably short rise/fall edges of the binary signal applied to the chip pad 61. This flattening becomes greater the greater the capacitance of the ESD protection diode. The same is also applicable to any kind of high frequency analog signals. Any capacitance acts like a low-pass filter for high frequency harmonics of the signal. The capacitance of the ESD protection diode is thus in the way of increasing the data rate of a signal at the chip pad 61.

SUMMARY OF THE INVENTION

It is the object of the present invention to provide an ESD protection apparatus for an electrical device with a low capacitance and an electrical device, which uses the inventive ESD protection apparatus.

In accordance with a first aspect, the present invention provides an ESD protection apparatus for an electrical device with a circuit structure having an internal terminal connected to an external terminal of the electrical device via a conductive connection, with a gas-filled cavity through which the conductive connection extends at least partly, and a reference electrode in the cavity, wherein the conductive connection is disposed in the cavity such that when a potential exceeding a predetermined threshold is applied to the external terminal, a gas discharge occurs from the conductive connection to the reference electrode.

In accordance with a second aspect, the present invention provides an electrical device with a circuit structure having an internal terminal, which is connected to an external terminal of the electric device via a conductive connection, an ESD protection apparatus and an ESD protection diode connected to the circuit structure, wherein the ESD protection structure comprises a gas filled cavity, through which the conductive connection extends at least partly, and a reference electrode in the cavity, wherein the conductive connection is disposed in the cavity such that when a potential exceeding a predetermined threshold is applied to the external terminal, a gas discharge occurs from the conductive connection to the reference electrode.

The present invention is based on the knowledge that part of the ESD event current can be drained by a gas discharge, so that a current through the ESD protection diode can be made smaller.

An ESD protection structure according to an embodiment of the present invention can be designed in order to have a lower capacitance than only an ESD protection diode. This allows the reduction of an input and an output capacitance, respectively, applied to a chip pad, whereby data rates of a higher frequency can be transmitted via the respective chip pad.

Above that, the ESD protection structure according to an embodiment of the present invention allows to embody the ESD protection diode for an overload current in a chip connected thereto. This is accompanied by an area reduction of the chip. Thereby, the chip can be produced at lower cost, wherein at the same time the yield in production increases with decreasing chip area.

In a device according to the present invention using an ESD protection apparatus according to an embodiment of the present invention and wherein additionally an ESD protection diode is attached to the internal terminal at the circuit structure, the ESD protection diode can be made with a significantly reduced area compared to the prior art. A portion of an occurring overvoltage can thereby be intercepted and limited at the ESD protection apparatus, while only a remaining low portion is accommodated by the ESD protection diode whose area can thus be smaller. The reduction of the area of the ESD protection diode is thereby accompanied by a decrease of capacitance of the ESD protection diode.

BRIEF DESCRIPTION OF THE DRAWINGS

These and other objects and features of the present invention will become clear from the following description taken in conjunction with the accompanying drawings, in which.

Figure 1:
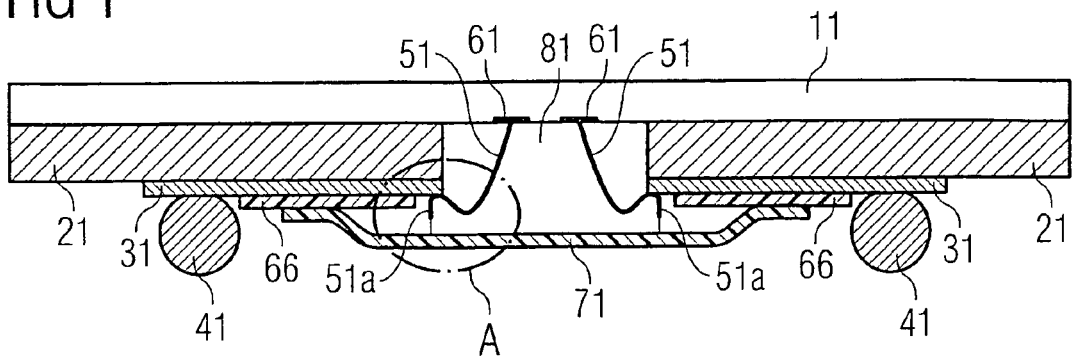
FIG. 1 is a structure of a BGA package with an ESD protection structure according to an embodiment of the present invention.

The following list of reference symbols can be used in conjunction with the figures
11 chip
21 package substrate
31 copper trace
41 solder ball
51a bond wire end
51b needle spike
61 chip pad
66 isolation layer
71 cover
81 rare gas

DESCRIPTION OF THE PREFERRED EMBODIMENTS

In the following description, the same or similar elements are provided with the same reference numbers.

FIG. 1 shows a structure of a BGA package with an ESD protection apparatus according to an embodiment of the present invention. The structure of the BGA package without ESD protection apparatus corresponds to the one described with reference to FIG. 3, so that a repeated illustration is omitted.

Figure 3:
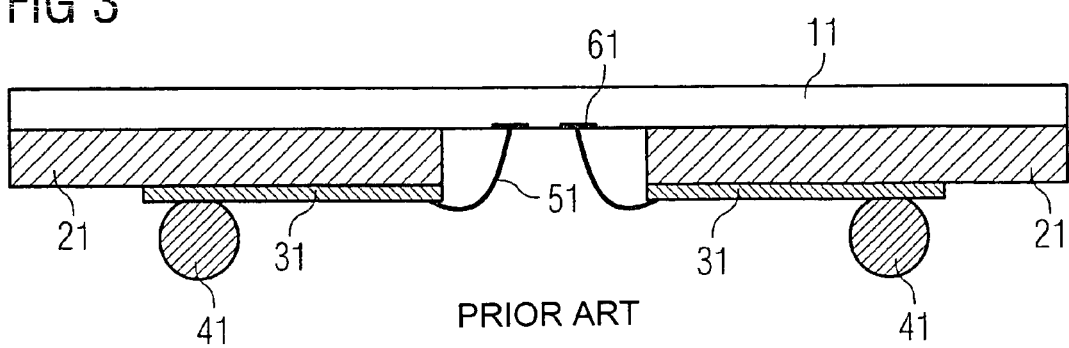
FIG. 3 is a section of a structure of a BGA package according to the prior art.

Additionally, in FIG. 1, compared with FIG. 3, bond wire ends 51a, an isolation layer 66 and a cover 71 are shown.

Here, the ESD protection apparatus is formed of the bond wire ends 51a disposed on the traces 31. These extend in the direction of a cover 71 disposed on an isolation layer 66. Thereby, a rare gas 81 is filled in the cavity formed of a chip 11, the package substrate 21, the traces 31, the isolation layers 66 and the cover 71.

Thereby, the cavity is substantially closed gas-tight, so that the rare gas 81 cannot leak out therefrom. The bond wires 51 between the chip pads 61 and the copper traces 31 extend to the cavity filled with rare gas 81. Thereby, the bond wires 51 are made such that the bond wire ends 51a extend from the trace 31 in the direction of the cover 71. This results in the spacing between the spike of the bond wire ends 51a and the cover 71 being small in relation to the spacing between the bond wire 51 and the cover 71. Thereby, the bond wire ends 51a are electrically conductively connected to the chip pads 61 and the solder balls 41.

The isolation layers 61 isolate the metallic cover 71 from the traces 31. The metallic cover 71 is connected to ground or supply voltage potential by for example a metal cover chuck not shown here reaching one or more balls normally connected to ground or supply voltage. If a signal of a high voltage, which is typically higher than an ignition voltage of the rare gas 81, is applied to the solder ball 41, as it occurs, for example, in an electrostatic discharge process, a gas discharge process occurs in the portion in the rare gas 81 between the spike of the bond wire ends 51a and the cover 71. Thereby, the gas discharge occurs between the spike of the bond wire end 51a being under high voltage and the metallic cover 71 connected to ground potential. This gas discharge process is accompanied with high current over the solder ball 41 and the trace 31 and limits the voltage at the chip pad 61. Thus, the chip pad 61 is protected against voltage overload.

Since the ESD event energy is partly dissipated and the voltage spike level is limited in a process of gas discharge, chip pads 61 are affected by significantly lower level of the voltage and current overload due to the above-shown ESD protection apparatus. The ESD protection diode or another protection device like a thyristor area at the chip pad 61, which frequently exists in circuit structures according to the prior art, can be reduced. This leads to a reduction of the capacitance applied to the chip pads 61.

In the embodiment according to the present invention shown here, the ESD protection apparatus utilizes the characteristic of some rare gases, such as helium, neon, krypton, and xenon, to be ionized in a strong electric field under low pressure. If the spikes of the bond wire ends 51a are made in the form of very sharp needles, the strength of the electrical field near the spikes of the needles becomes so strong that gas discharge could be ignited and triggered, respectively, at voltages in the range of several volts or tens of volts. After the discharge has been ignited a dependence of the voltage across the discharge portion on the current is thus very flat. Even with a ten-fold increase of the current, the voltage changes by about 30%. This effect is, for example, used in neon lamps, which operate as voltage stabilizing elements.

The discharge gap is made between the bond wire end 51a and the metallic cover 71, which is preferably connected to a supply voltage pin of the chip 11 or ground. Thereby, the bond wire ends 51a have preferably sharp needled-shaped spikes 51b. These needle-shaped spikes can be made integrally with the bond wire 51.

The spacing between the needled-shaped spike 51b and the cover 71, form and sharpness of the needles, respectively, the kind of gas and pressure under the cover are chosen to trigger and ignite, respectively, a gas discharge at voltages between electrodes in the range of several volts or tens of volts.

Such a structure is definitely not sufficiently able to limit the voltage to a value not larger than the supply voltage of the chip. The supply voltage for modern high frequency chips is not higher than 5 volts normally. However, it allows to reduce the requirements concerning on-chip ESD diodes. Thereby, the same power of ESD protection can be reached with a smaller chip area The position of the needles 51b before the bond wires gives an additional advantage, in that the bond wire 51 inductance limits the current after the discharge gap.

The position of the grounded cover 71 has the advantage of an additional EMC shielding between the chip and traces on the printed circuit board, where the chip is soldered.

The additional capacitance generated by the ESD protection apparatus according to an embodiment of the present invention will be negligibly low and low in comparison to the ESD protection apparatus, respectively, where only protection diodes are used at the chip pads 61, since the area of the needle spikes is very low. Thus, the area of the electrodes of the parasitic capacitor of the ESD protection apparatus is very small.

Figure 2:
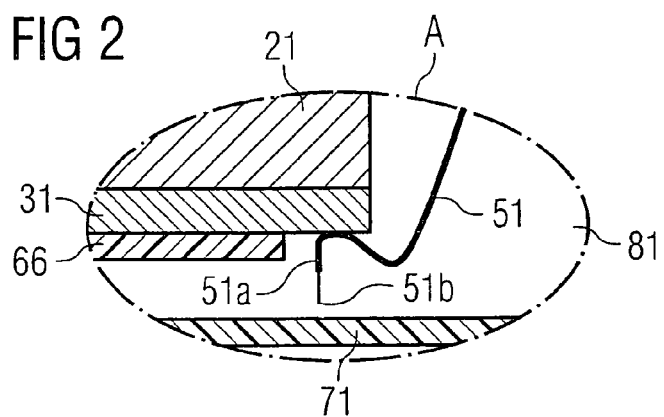
FIG. 2 is an increased illustration of the section A of FIG. 1.

In FIG. 2, a section A of the structure of a BGA package with ESD protection apparatus according to an embodiment of the present invention shown in FIG. 1 is shown. Apart from the elements already known from FIG. 1, a needle spike 51b is particularly emphasized here.

When applying a potential exceeding a certain threshold to the solder balls 41, an ignition of the rare gas 81 occurs in the region between the needle spike 51b and the metallic cover 71. This leads to a high current across the gas discharge and a breakdown of the voltage at the bond wire 51, whereby the chip pad 61 is protected against overvoltage. By the form of the needle spike 51b and the spacing of the needle spike 51b from the metallic cover 71, the threshold where the gas discharge occurs and the ignition voltage can be set, respectively.

In the above embodiments, the structure of a BGA package with the ESD protection apparatus according to an embodiment of the present invention is shown. Alternatives are, however, other packages, such as MQFP or PQFP packages, which can be protected against overload by an ESD protection apparatus made that way. Alternatives are even terminals of electrical devices, which extend through a cavity filled with the rare gas 81. For some applications like chips of line receivers/transmitters affected by high voltage EMI pulses such ESD protection method could be implemented in the way of a separate external device or a sub-package portion somehow electrically connected to the normally packaged and ESD protected standard chip.

In the above embodiments, the cavity is preferably filled with rare gas 81. Alternatives are, however, different gas types. The chip 11 in the above embodiments could also alternatively be embodied as any electrical device, which is connected to the external terminal 31 via the internal terminal 61.

The bond wire 51 could also alternatively be embodied as any electrical trace, such as an electrically conductive layer disposed on the package substrate 21.

In the above embodiments, the cover 71 is made of a metallic material. However, an alternative would be a cover of a conductive non-metallic material, such as a highly doped semiconductor layer or an electrode disposed on the cover 71, which is, in this case, made of an isolating material, which is preferably disposed close to a needle spike 51b.

In the above embodiments, protection of the chip 11 is realized via the ESD protection apparatus according to an embodiment of the present invention, wherein an ESD protection diode disposed on a chip 11 is connected to the chip pad 61. Alternatively, however, the ESD protection apparatus according to an embodiment of the present invention can also be realized together with a diode externally connected to the chip pad 61.

While this invention has been described in terms of several preferred embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An ESD protection apparatus for an electrical device with a circuit structure having an internal terminal, which is connected to an external terminal of the electrical device via a conductive connection, comprising:
    a gas-filled cavity through which the connection extends at least partly; and
    a reference electrode in the cavity;
    wherein the conductive connection is disposed in the cavity such that when applying a potential exceeding a predetermined threshold to the external terminal, a gas discharge occurs from the conductive connection to the reference electrode; and
    wherein a wire piece extends from the conductive connection to the reference electrode such that the gas discharge can occur between a portion of the wire piece and the reference electrode.

2. The ESD protection apparatus according to claim 1, wherein the conductive connection comprises a bond wire.

3. The ESD protection apparatus according to claim 1, wherein the portion of the wire piece from which the gas discharge can occur to the reference electrode has a needle form.

4. The ESD protection apparatus according to claim 1, wherein the portion of the wire piece from which the gas discharge can occur to the reference electrode is disposed at one end of the wire piece.

5. An ESD protection apparatus for an electrical device with a circuit structure having an internal terminal, which is connected to an external terminal of the electrical device via a conductive connection, comprising:
    a gas-filled cavity through which the connection extends at least partly; and
    a reference electrode in the cavity, wherein the cavity is disposed between a package substrate wherein the circuit structure is disposed and a cover disposed on the package substrate and wherein the reference electrode is disposed on the cover;
    wherein the conductive connection is disposed in the cavity such that when applying a
    wherein the conductive connection is disposed in the cavity such that when applying a potential exceeding a predetermined threshold to the external terminal, a gas discharge occurs from the conductive connection to the reference electrode.

6. The ESD protection apparatus according to claim 5, wherein the cover is made of a conductive material, so that the cover forms the reference electrode.

7. An ESD protection apparatus for an electrical device with a circuit structure having an internal terminal, which is connected to an external terminal of the electrical device via a conductive connection, comprising:
    a gas-filled cavity through which the connection extends at least partly; and
    a reference electrode in the cavity, wherein the reference electrode is conductively connected to a ground terminal or a supply voltage terminal of the circuit structure;

wherein the conductive connection is disposed in the cavity such that when applying a potential exceeding a predetermined threshold to the external terminal, a gas discharge occurs from the conductive connection to the reference electrode.

8. The ESD protection apparatus according to claim 7, wherein the cavity is disposed between a package substrate wherein the circuit structure is disposed and a cover disposed on the package substrate.

9. The ESD protection apparatus according to claim 8, wherein the internal terminal or the external terminal are disposed on the package substrate.

10. The ESD protection apparatus according to claim 7, wherein gas in the gas-filled cavity comprises rare gas.

11. An electrical device, comprising:
   a circuit structure having an internal terminal, which is connected to an external terminal of the electrical device via a conductive connection:
   an ESD protection apparatus; and
   an ESD protection diode connected to the circuit structure;
   wherein the ESD protection apparatus comprises:
   a gas-filled cavity, through which the conductive connection extends at least partly; and
   a reference electrode in the cavity;
   wherein the conductive connection is disposed in the cavity such that when a potential exceeding a predetermined threshold is applied to the external terminal, a gas discharge occurs from the conductive connection to the reference electrode.

12. The electrical device according to claim 11, wherein the conductive connection comprises a bond wire.

13. The electrical device according to claim 11, wherein the internal terminal or the external terminal are disposed on the package substrate.

14. The electrical device according to claim 11, wherein the reference electrode is conductively connected to a ground terminal or a supply voltage terminal of the circuit structure.

15. The electrical device according to claim 11, wherein gas in the gas-filled cavity comprises rare gas.

16. The electrical device according to claim 11, wherein a wire piece extends from the conductive connection to the reference electrode such that the gas discharge can occur between a portion of the wire piece and the reference electrode.

17. The electrical device according to claim 16, wherein the portion of the wire piece from which the gas discharge can occur to the reference electrode has a needle form.

18. The electrical device according to claim 16, wherein the portion of the wire piece from which the gas discharge can occur to the reference electrode is disposed at one end of the wire piece.

19. The electrical device according to claim 11, wherein the cavity is disposed between a package substrate wherein the circuit structure is disposed and a cover disposed on the package substrate.

20. The electrical device according to claim 19, wherein the reference electrode is disposed on the cover.

21. The electrical device according to claim 19, wherein the cover is made of a conductive material, so that the cover forms the reference electrode.

22. An ESD protection apparatus for an electrical device with a circuit structure having an internal terminal, which is connected to an external terminal of the electrical device via a conductive connection, comprising:
   a gas-filled cavity through which the conductive connection extends at least partly;
   a reference electrode in the cavity; and
   means for causing a gas discharge to occur from the conductive connection to the reference electrode when a potential exceeding a predetermined threshold is applied to the external terminal.

* * * * *